US005612550A

United States Patent [19]
Gomyo et al.

[11] Patent Number: 5,612,550
[45] Date of Patent: Mar. 18, 1997

[54] HETEROJUNCTION TYPE SEMICONDUCTOR DEVICE HAVING ORDERED PHASE ALLOY LAYERS FOR ACTIVE AND CLADDING LAYERS

[75] Inventors: Akiko Gomyo; Tohru Suzuki, both of Tokyo, Japan

[73] Assignee: NEC Corporation, Tokyo, Japan

[21] Appl. No.: 395,500

[22] Filed: Feb. 24, 1995

[30] Foreign Application Priority Data

Feb. 24, 1994 [JP] Japan ...... 6-025827
Jan. 30, 1995 [JP] Japan ...... 7-013074

[51] Int. Cl.⁶ ...... H01L 31/0328; H01S 3/30; H01S 3/19
[52] U.S. Cl. ...... 257/184; 257/200; 372/7; 372/48
[58] Field of Search ...... 257/183, 183.1, 257/184, 200, 201, 628, 613; 372/7, 48

[56] References Cited

U.S. PATENT DOCUMENTS

| | | |
|---|---|---|
| 4,591,889 | 5/1986 | Gossard et al. |
| 5,153,890 | 10/1992 | Bona et al. ...... 372/48 |
| 5,455,883 | 10/1995 | Shigeta et al. ...... 359/42 |

FOREIGN PATENT DOCUMENTS

| | | |
|---|---|---|
| 61-144076 | 7/1986 | Japan . |
| 61-144070 | 7/1986 | Japan . |
| 4093088 | 3/1992 | Japan . |

OTHER PUBLICATIONS

Gomyo, A., et al., "Observation of a New Ordered Phase in $Al_xIn_{1-x}$ As Alloy and Relation between Ordering Structure and Surface Reconstruction During Molecular-Beam-Epitaxial Growth", Phys. Review Letters, vol. 72, No. 5, 31 Jan. 1994, pp. 673-676.

Petroff, P.M., et al., "Band Gap Modulation in Two Dimensions by MBE Growth of Titled Superlattices and Applications to Quantum Confinement Structures", Journal of Crystal Growth, vol. 95, No. 104, Feb. 1989, pp. 260-265.

Yamamoto, T., et al., "Periodic lateral structure of Al content modulations in AlGaAs grown on vicinal (lll)A GaAs by molecular beam epitaxy", Journal of Cyrstal Growth, vol. 127, No. 1/4, Feb. 1993, pp. 865-870.

Primary Examiner—Sara W. Crane
Assistant Examiner—Fetsum Abraham

[57] ABSTRACT

A heterojunction semiconductor device has a plurality of ordered phase alloy layers. Either the whole or a part of each of the ordered phase alloy layers has a crystal structure (triple-period structure) in which the ordered alloy is of a composition corresponding to the [111]A direction and an anion composition modulation period that is triple that of a disordered structure. The double-period structure may alternatively be used. The triple-period or double-period structure applied to the layer structure of the heterostructure semiconductor device results in a reduction of the bandgap.

12 Claims, 2 Drawing Sheets

HETEROJUNCTION TYPE SEMICONDUCTOR DEVICE HAVING ORDERED PHASE ALLOY LAYERS FOR ACTIVE AND CLADDING LAYERS

BACKGROUND OF THE INVENTION

1. Field of the Invention

The present invention relates to structures of semiconductor electronic products, and more particularly to a compound semiconductor device such as a semiconductor laser, a photoreceptor, an opto-electronic integrated circuit device and a high frequency electronic device.

2. Description of the Related Art

Conventionally, a heterojunction type compound semiconductor device such as a photoreceptor, a semiconductor laser, an optical device such as an optical integrated device and a high frequency electronic device is configured using a heterostructure formed by an epitaxial crystal which is lattice-matched to the substrate crystal, or by a strained epitaxial crystal in which the lattice constant is slightly mismatched.

(1) For the above heterostructure, since the binary crystal such as GaAs or InP is used as a substrate crystal, the kinds of the compound semiconductor alloys which can be used are limited when the lattice matching conditions or, in the case of the strained crystal, the elasticity strain limits, are taken into consideration. Thus, there are cases where it is difficult or impossible for the conditions required for the oscillating and light receiving wavelengths to be satisfied during the designing of a device such as a semiconductor laser or a light receiving element. If these conditions or limitations during the designing stage can be relaxed, there will be a great advantage in increasing a degree of freedom in the device designing.

(2) In fabricating an optically integrated device, it is desirable that the bandgap be made variable in the longitudinal direction of a waveguide and, in fabricating the waveguide, it is desirable that the bandgap and the refractive index be made variable in the direction orthogonal to the longitudinal direction of the waveguide within a surface of the crystal, that is, in the lateral direction of the waveguide. To this end, conventionally, there have been employed processes in which a part of the epitaxial layer grown is removed by etching, and a layer that has a different bandgap is newly and selectively grown. However, such processes are time consuming, and are often accompanied by problems associated with lattice defects in the crystal at re-grown interfaces. Thus, it would be advantageous if, by avoiding such processes, the bandgap variation and the refractive index variation without crystal defects can be achieved.

SUMMARY OF THE INVENTION

According to the present invention, in order to solve the above problems (1) and (2), use is made, in part, of a heterostructure having a triple-period type compound alloy semiconductor that can exist in a compound semiconductor alloy. The invention provides a heterojunction type semiconductor device in which two or more kinds of anions constitute an ordered structure of a face centered cubic (FCC) sublattice, and which is constituted by a plurality of kinds of compound semiconductor layers including one kind or a number (N) of kinds of compound semiconductor alloys. The whole or a part of each of the ordered phase alloy layers has a crystal structure in which the ordered phase alloy is of a composition corresponding to the [111]A direction (hereinafter also referred to as direction "A") and which has an anion composition modulation period that is triple that of a disordered structure (hereinafter referred to as "triple-period structure"). The device is suited to a semiconductor laser, an optical modulator, a photoreceptor, an electronic device, and their opto-electronic integrated devices.

The triple-period type ordered phase is formed under predetermined growth conditions in, for example, $Ga_xIn_{1-x}As$ and $Al_xIn_{1-x}As$, or in the quaternary crystals GaInAsP and AlInAsP.

FIG. 5 is a diagram showing the ordered phase AlInAs of a triple-period type structure wherein [001] is the crystal growth direction. The average composition of Al in the crystal is $(x+y+z)/3$. As shown in FIG. 5, in the [111]A direction, there is formed a superlattice structure in which the group III compositions are modulated in a period triple that of a conventional disordered structure in the same direction. In the crystal having this triple-period type ordered layer, there is a decrease in the bandgap of the order of 100 meV~200 meV as compared with the disordered type crystal. This means that, in the wavelength band of 1.5 μm which is used in optical communication, it is possible, when the wavelength of the disordered type GaInAsP is 1.5 μm, to obtain a bandgap whose wavelength is longer by 0.2 μm~0.5 μm than 1.5 μm even with the same alloy composition. That is, since it is possible to obtain the wavelength difference and bandgap difference to the above extent while the lattice matched epitaxial growth conditions are maintained, the degree of design freedom can be increased by introducing the ordered phase crystal explained above into a part of the heterojunction structure.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments are explained with reference to the drawings.

Figure 1:
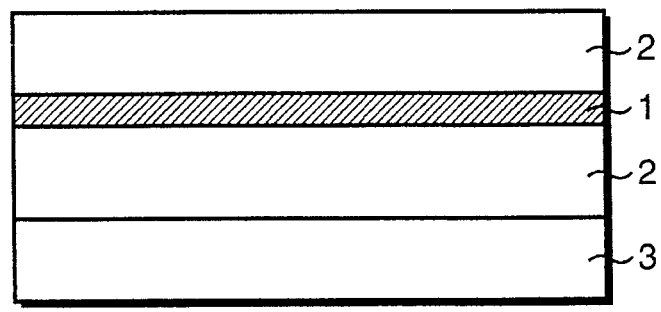
FIG. 1 is a diagrammatic sectional view seen from a side thereof, showing a double heterostructure semiconductor laser of a first embodiment according to the invention.

FIG. 1 shows, in a diagrammatic sectional view seen from the side thereof, a double heterostructure semiconductor laser of a first embodiment according to the invention. Shown in FIG. 1 is a basic configuration of the double heterostructure type semiconductor laser having, above an InP substrate crystal 3, a triple-period type ordered phase $Ga_{0.5}In_{0.5}As$ active layer 1 and disordered phase $Al_{0.5}In_{0.5}As$ cladding layers 2 provided at two sides of the active layer 1. The growth is carried out using molecular beam expitaxy (MBE). The triple-period type crystal grows under the conditions of lower temperature and higher pressure as compared with the MBE growth temperature and the V group pressure as applied to an ordinary disordered phase crystal. For example, the $Ga_{0.5}In_{0.5}As$ active layer 1 may be grown at a growth temperature of 490° C. and an internal chamber pressure of $5 \times 10^{-5}$ Torr. These conditions may be satisfied if a combination of the growth temperature and the internal chamber pressure is within a range so as to be on the lower temperature side and on the higher chamber pressure side of a line (on a graph) that passes approximately through the above mentioned point and each of the points 470° C., $2 \times 10^{-5}$ Torr and 520° C., $2 \times 10^{-4}$ Torr. The doping may be carried out by conventional MBE using Be in the case of p-type and Si in the case of n-type, similarly as for longer wavelength band lasers. In the laser thus fabricated, while the $Ga_{0.5}In_{0.5}As$ active layer is in a state of lattice matching with the substrate InP, the oscillation can take place at a longer wavelength wherein the oscillation wavelength is 2 μm longer. It is possible to obtain the oscillation wavelength of 2 μm even when the disordered crystal is used for the active layer if the composition is shifted to an In excess side. In such a case, however, the active layer is subjected to a large compression strain giving rise to a problem of long term reliability. In this respect, in the laser of this embodiment according to the invention, since the lattice is well matched, there is a high long term reliability.

Figure 2:
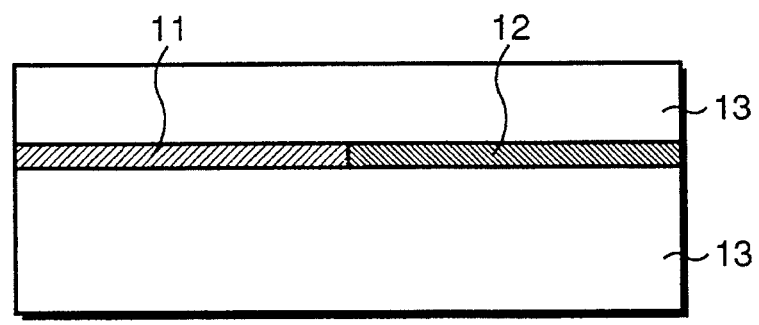
FIG. 2 is a diagrammatic sectional view seen from a side thereof, showing an optical integrated device of a second embodiment according to the invention, in which a semiconductor laser and an optical modulator are integrated.

FIG. 2 diagrammatically shows an optically integrated device of a second embodiment according to the invention, wherein a semiconductor laser and an optical modulator are integrated. The figure shows, in a sectional view, a layer structure, viewed from the side, in which a waveguide of the device extends longitudinally thereof. This heterostructure is configured such that the waveguide core layer GaInAs having a high refractive index partly has an ordered phase 11 and partly has a disordered phase 12, with the former being used as a laser portion and the latter being used as an optical modulator portion. The cladding layer portions 13 may use, for example, InP or AlInAs layers. The ordered phase 11 may be grown in the same way as the $Ga_{0.5}In_{0.5}As$ active layer 1 explained with respect to the first embodiment of the invention.

In the above configuration, the GaInAs waveguide layer constituted by a triple-period type ordered phase 11 has a bandgap lower than that in the crystal of disordered phase 12 of the same composition, so that the oscillating light of the semiconductor laser using this portion as an active layer is transparent with respect to the waveguide core layer of the optical modulator formed at the disordered portion when the modulator is in an OPEN state. For forming the disordered phase together with the ordered phase within the same layer, impurity atom diffusion or impurity atom ion implantation followed by the annealing to restore the crystallization (changing to a disordered state) may be carried out. In this way, it is possible to fabricate a semiconductor laser/optical modulator integrated device in which waveguide losses are small and which exhibits excellent modulation characteristics.

Figure 3:
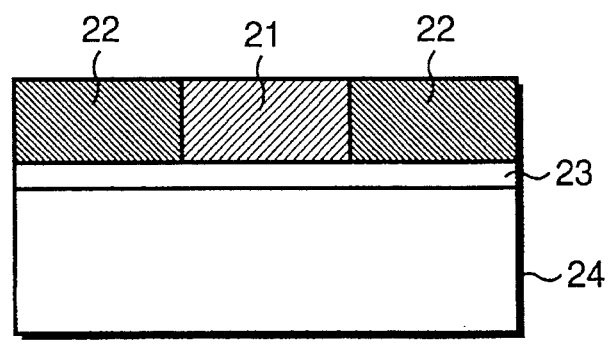
FIG. 3 is a diagrammatic sectional view seen in the direction of a stripe therein, showing a double heterostructure semiconductor laser of a third embodiment according to the invention, in which a ridge type waveguide is provided.

FIG. 3 shows a semiconductor laser of a third embodiment according to the invention. The figure shows, in a partial sectional view, the semiconductor laser as viewed in the direction of the stripe therein, which includes a ridge type waveguide. The active layer GaInAs 23 is sandwiched between two cladding layers AlInAs 24, and the center region of one of the cladding layers is a current stripe portion for the current to be injected and is also a ridge portion for guiding the light for the lateral mode control. This ridge portion is constituted by AlInAs of an ordered phase 21, and the low refractive index portions at two sides thereof are constituted by disordered crystals 22 of the same composition, namely, AlInAs. A growth temperature and an internal chamber pressure of AlInAs of the ordered phase 21 may be the same as those explained with reference to the first embodiment of the invention. The disordered phase 22 may be formed in the same way as that explained with reference to the second embodiment of the invention. Thus, by forming the ridge waveguide structure as shown in FIG. 3 for the same composition AlInAs, it is possible to fabricate a semiconductor laser in which the lateral mode is well controlled and which is well suited to optically integrated devices. If, during the conversion of the ordered phase to a disordered phase, there is a likelihood of crystal defects being introduced into an active layer, it is possible to arrange that a thin layer not converted to a disordered phase be left as a buffer layer between the active layer and the ridge type waveguide layer of an amount that does not affect the mode control.

Figure 4:
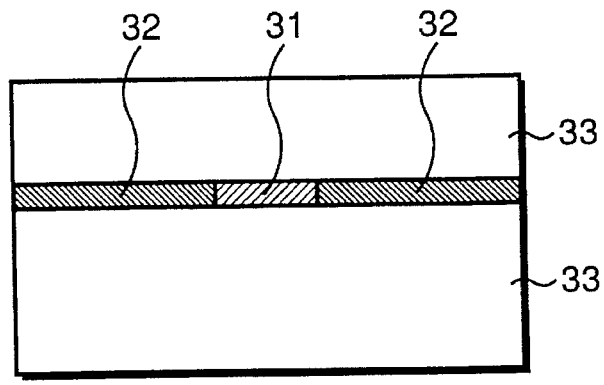
FIG. 4 is a diagrammatic sectional view showing a lateral mode control type semiconductor device of a fourth embodiment according to the invention.
Figure 5:
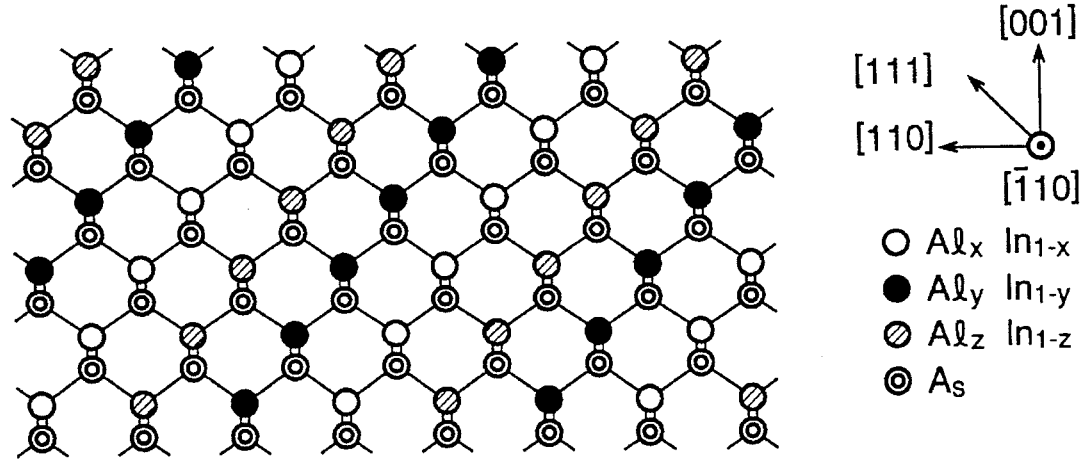
FIG. 5 is a diagram showing an ordered AlInAs structure of triple periodicity.

FIG. 4 relates to a semiconductor laser of a fourth embodiment according to the invention. The figure shows, in a diagrammatic sectional view, a stripe portion of the active layer and cladding layers 33 of a double heterostructure type semiconductor laser. As shown in FIG. 4, for example, the active layer consists of a stripe type GaInAs ordered phase portion 31 which is for the lateral mode control and disordered phase portions 32 which are provided respectively at two sides thereof, and there are provided cladding layers 33 which are in contact with the active layer and formed of AlInAs or InP. A growth temperature and an internal chamber pressure of the ordered phase 31 may be the same as those explained with reference to the first embodiment of the invention. As a method for forming the active layer having partially different phases, use may be made of the method explained, for example, with reference to the second embodiment according to the invention. In the double heterostructure type semiconductor laser thus fabricated, the stripe portion is of an ordered phase so that the bandgap is smaller than that in the disordered phase portion. Therefore, the carriers injected are concentrated at the stripe portion, and the bandgap difference increases the relative magnitude of the refractive index at the stripe portion, and this is effective in the lateral mode control of the laser light and enables the realization of a semiconductor laser having excellent mode characteristics.

A fifth embodiment relates to an application of the first embodiment. That is, in the first embodiment, it is made possible to obtain the laser light that oscillates at a wavelength not shorter than 2 μm by using $Ga_{0.5}In_{0.5}As$ for the active layer composition. In this embodiment, use is made of an alloy of the ordered phase in the light absorption layer of the photoreceptors (such as PIN photodiode and avalanche photodiode) to receive the laser light and convert it to an electrical signal and, in this way, it is possible to make the wavelength of a light absorption edge longer resulting in the extension of the receiving wavelength. Additionally, if this light receiving element is used in 1.3~1.5 μm bands, it is possible to increase the light absorption efficiency so that the quantum efficiency is enhanced and the reception sensitivity is increased.

As a matter of course, it is possible to fabricate an optically integrated element as an element provided with a lateral mode control function which is realized according to the third and fourth embodiments of the invention.

The crystal, in the case where the device is for use in 1.3~1.5 μm band optical communication, may be formed using the GaInPAs and AlGaInPAs systems.

The foregoing embodiments have been explained mainly with respect to the triple-period ordered phase. However, although the bandgap variations are larger in the triple-period ordered phase, the double periodicity in the [111]A direction produces similar effects and can be applied to the above explained semiconductor devices. The following gives examples in which the double period ordered phase in the [111]A direction is used.

A sixth embodiment according to the invention is explained with reference to FIG. 3 which was earlier used for explaining the third embodiment according to the invention. The figure shows, in a partial sectional view, the semiconductor laser as viewed in the direction of the stripe, which is provided with a ridge type waveguide. The active layer GaInP 23 is sandwiched between two cladding layers AlInP 24, and the center region of one of the cladding layers is a current stripe portion for the current to be injected and is also a ridge portion for guiding the light for the lateral mode control. This ridge portion is constituted by AlInP of an ordered phase 21, and the low refractive index portions at two sides thereof are constituted by disordered crystals 22 of the same composition AlInP. The AlInP layer of the ordered phase 21 may be grown at a growth temperature of 520° C. and an internal chamber pressure of 5×10$^{-5}$ Torr. These conditions may be satisfied if a combination of the growth temperature and the internal chamber pressure is within a range so as to be on the lower temperature side and on the higher chamber pressure side of a line (on a graph) that passes approximately through the above mentioned point and each of the points 560° C., 1×10$^{-4}$ Torr and 520° C., 2×10$^{-5}$ Torr. The disordered phase may be formed in the same way as that explained with reference to the second embodiment of the invention. Thus, by forming the ridge waveguide structure as shown in FIG. 3 for the same composition AlInP, it is possible to fabricate a semiconductor laser in which the lateral mode is well controlled and which is well suited to optical integrated devices. If, during the conversion of the ordered phase to a disordered phase, there is a likelihood of crystal defects being introduced into an active layer, it is possible to arrange that a thin layer not converted to a disordered phase be left as a buffer layer between the active layer and the ridge type waveguide layer of an amount that does not affect the mode control.

A seventh embodiment according to the invention is explained with reference to FIG. 4 which was earlier used for explaining the fourth embodiment according to the invention. The figure shows, in a diagrammatic sectional view, a stripe portion of the active layer and cladding layers 33 of a double heterostructure type semiconductor laser. As shown in FIG. 4, for example, the active layer consists of a stripe type $(Al_xGa_{1-x})_{0.5}In_{0.5}P$ (x=0.2) ordered phase portion 31 for the lateral mode control and disordered phase portions 32 respectively at two sides thereof, and there are provided cladding layers 33 in contact with the active layer and formed of AlInP or $(Al_{x'}Ga_{1-x'})_{0.5}In_{0.5}P$ (x'=0.7,x'>x). For the ordered phase portion 31, the same growth conditions as those explained with reference to the sixth embodiment may be used. As a method for forming the active layer having partially different phases, use may be made of the method explained, for example, with reference to the second embodiment according to the invention. In the double heterostructure type semiconductor laser thus fabricated, the stripe portion is of an ordered phase so that the bandgap is smaller than that in the disordered phase portion. Therefore, the carriers injected are concentrated at the stripe portion, and the bandgap difference increases the relative magnitude of the refractive index at the stripe portion, and this is effective in the lateral mode control of the laser light, thereby enabling the realization of a semiconductor laser having excellent mode characteristics.

Thus, the crystal, in the case where the device is used such as for information processing which is in 0.6~0.7 μm bands (red), may be formed using any of the GaInP, AlGaInP and AlInP systems with these being lattice-matched to a GaAs substrate.

By a semiconductor device in which a triple-period or double-period compound semiconductor ordered alloy is applied to the layer structure of the heterostructure semiconductor device, it is possible to extend the oscillation wavelength region without introducing any large strain to the crystal, for example, a large extension to 2 μm or more in a 1.5 μm band semiconductor laser, thereby providing a highly reliable semiconductor laser. Also, for the same reason, it is made possible to provide optical receivers in which an optical receiving wavelength is extended.

In the alloy of the triple-period ordered phase, as compared with the disordered phase alloy of the same composition, the bandgap is smaller by more than 100 meV and the refractive index is correspondingly smaller. Thus, the application of the present invention enables the provision of a semiconductor laser having excellent lateral control characteristics, and also the provision of various optical integrated elements including a semiconductor laser optical modulator integrated element in which coupling losses are small and lateral mode controlling characteristics are excellent.

Also, in the alloy of the [111]A direction double period ordered phase, as compared with the disordered phase alloy of the same composition, the bandgap is smaller by more than 100 meV and the refractive index is correspondingly smaller, which results in the same advantages as in the triple-period ordered phase.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A heterojunction semiconductor device which has an ordered structure of at least two kinds of anion on a face centered cubic (FCC) sublattice and is constituted by a plurality of kinds of compound semiconductor layers including one or more kinds of compound semiconductor alloys, wherein the improvement comprises a plurality of ordered phase alloy layers, at least a part of each of said ordered phase alloy layers having a crystal structure (triple-period structure) in which the ordered alloy is of a composition corresponding to direction "A" and which has an anion composition modulation period that is triple that of a disordered structure.

2. The heterojunction semiconductor device according to claim 1, which is a double heterojunction semiconductor laser, and which comprises an active layer having the triple-period structure.

3. The heterojunction semiconductor device according to claim 2, in which said active layer, with the exception of a stripe-shaped current injection region thereof, is a disordered alloy structure.

4. The heterojunction semiconductor device according to claim 2, in which said active layer is one of $Ga_xIn_{1-x}As$ and $Ga_xIn_{1-x}P_yAs_{1-y}$.

5. The heterojunction semiconductor device according to claim 1, which is an integrated element in which a semiconductor laser and an optical modulator are coupled by a waveguide, and which comprises a semiconductor laser active layer which is an ordered alloy structure and a high refractive index waveguide core layer which extends longitudinally along and in contact with said semiconductor laser active layer and is of the disordered structure constituting said optical modulator.

6. The heterojunction semiconductor device according to claim 5, in which said high refractive index waveguide core layer is one of $Ga_xIn_{1-x}As$ and $Ga_xIn_{1-x}P_yAs_{1-y}$.

7. The heterojunction semiconductor device according to claim 1, which is a ridge type semiconductor laser, and which comprises a stripe-shaped ridge portion which is in contact with an active layer of a heterojunction ridge structure waveguide type semiconductor laser of a triple-period structure, and a cladding layer portion which is disposed at each of two sides of said stripe-shaped ridge portion, thereby providing a lateral mode control function.

8. The heterojunction semiconductor device according to claim 7, in which said cladding layer portion is one of $Al_xIn_{1-x}As$ and $Al_xIn_{1-x}P_yAs_{1-y}$.

9. The heterojunction semiconductor device according to claim 5, in which at least one of said semiconductor laser and said optical modulator comprises a stripe-shaped ridge portion which is in contact with an active layer of a heterojunction ridge structure waveguide type semiconductor laser of the triple-period structure, and a cladding layer portion which is provided at each of two sides of said stripe-shaped ridge portion, thereby providing a lateral mode control function.

10. The heterojunction semiconductor device according to claim 1, in which said crystal structure comprises one of a PIN photodiode and an avalanche photodiode, and a photo detecting layer thereof is of the triple-period structure.

11. The heterojunction semiconductor device according to claim 10, in which said photo detecting layer is of one of $Ga_xIn_{1-x}As$ and $Ga_xIn_{1-x}P_yAs_{1-y}$.

12. A heterojunction semiconductor device which has an ordered structure of at least two kinds of anion on a face centered cubic (FCC) sublattice and is constituted by a plurality of kinds of compound semiconductor layers including one or more kinds of compound semiconductor alloys, wherein the improvement comprises a plurality of ordered phase alloy layers, at least a part of each of said ordered phase alloy layers having a crystal structure (Cu-Pt type superlattice structure) in which the ordered alloy is of a composition corresponding to a [111]A direction and which has an anion composition modulation period that is double that of a disordered structure.

* * * * *